United States Patent [19]
Budker et al.

[11] 4,019,088
[45] Apr. 19, 1977

[54] ELECTROVACUUM SHF APPARATUS

[76] Inventors: Gersh Itskovich Budker, ulitsa Maltseva, 6; Sergei Nikolaevich Morozov, ulitsa Tereshkovoi, 42, kv. 3; Oleg Alexandrovich Nezhevenko, ulitsa Tereshkovoi, 7, kv. 1; Gennady Nikolaevich Ostreiko, Morskoi prospekt, 60, kv. 24; Isai Abramovich Shekhtman, ulitsa Ilicha, 15, kv. 68, all of Novosibirsk, U.S.S.R.

[22] Filed: Apr. 8, 1975

[21] Appl. No.: 566,049

[52] U.S. Cl. .............................. 315/5.24; 315/5.25; 315/5.26; 315/5
[51] Int. Cl.² .......................................... H01J 25/22
[58] Field of Search .............. 315/5.24, 5.25, 5.26, 315/5.27, 4, 5, 3

[56] References Cited
UNITED STATES PATENTS

| | | | |
|---|---|---|---|
| 2,408,437 | 10/1946 | McRae | 315/5.25 |
| 2,418,735 | 4/1947 | Strutt et al. | 315/5.25 |
| 2,469,964 | 5/1949 | Hartman | 315/5.24 X |
| 3,219,873 | 11/1965 | Kaufman | 315/5.25 |
| 3,221,207 | 11/1965 | Kaufman et al. | 315/5.25 |
| 3,489,943 | 1/1970 | Denholm | 315/5 |
| 3,885,193 | 5/1975 | Budker et al. | 315/5.24 |

FOREIGN PATENTS OR APPLICATIONS

954,840  1/1962  United Kingdom ............. 315/5.24

*Primary Examiner*—Saxfield Chatmon, Jr.

[57] ABSTRACT

Vacuum SHF apparatus comprising a means for forming a charged-particle beam, an accelerating tube for imparting relativistic energies to the charged-particle beam, and a deflection yoke for circular scanning of the beam at an input signal frequency, the accelerating tube and the deflection yoke being arranged coaxially with the beam forming means and successively along the path of the charged-particle beam. The apparatus further comprises an additional magnetic deflection yoke for deflecting the scanned beam outwardly from the longitudinal axis of the apparatus, and an annular travelling-wave resonator. The additional magnetic deflection yoke is preferably made as a cone whose vertex faces the charged-particle beam forming means. The annular travelling-wave resonator is so designed that its broader walls are parallel to the longitudinal axis of the apparatus, the broader walls being provided with annular slots for the charged-particle beam, that has been deflected by the additional deflection yoke, to enter and leave the annular resonator. The annular resonator is provided with means for taking SHF energy therefrom.

5 Claims, 6 Drawing Figures

ELECTROVACUUM SHF APPARATUS

The present invention relates to vacuum apparatus and, more particularly, to vacuum SHF apparatus used as high- and superhigh-frequency power amplfiers and multipiers in different radio engineering systems, for example, charged-particle accelerators.

Known in the art is an electrovacuum SHF apparatus comprising a means for forming an axially symmetrical charged-particle beam; arranged coaxially with said charged-particle beam forming means, along the path of the beam, are an accelerating tube for imparting relativist energies (a velocity close to that of light) to the beam particles, a deflection yoke for circular scanning of said beam under the action of an input signal, and an annular travelling-wave resonator excited by said beam, which resonator has annular slots in the end face walls thereof to receive the charged-particle beam and direct it to a collector, said resonator also having an electromagnet producing a stationary magnetic field to compensate for the action of the high-frequency magnetic field of the wave travelling in the resonator, at the place of the beam passage.

The foregoing apparatus has a number of disadvantages. First, its amplification factor is relatively low, as compared to the klystron, for example (the amplification factor in this case is the ratio between the output power and the power consumed by the circular scanning system). This disadvantage is felt especially strongly in high-power systems, when the beam length is substantially limited due to its divergence under the action of a space charge, and when there arises the necessity of deflecting the beam by an angle of 25° to 30°.

There is known a technical solution that makes it possible to raise the gain in systems with circular beam scanning and an annular travelling-wave resonator. For this purpose, the annular travelling-wave resonator is so arranged in the known apparatus that its broader walls, provided with slots for beam passage, are parallel with the longitudinal axis of the apparatus. Arranged between the circular scanning system and the annular resonator is an electrostatic deflection yoke to deflect the beam outwardly from the longitudinal axis of the apparatus and direct it into the slots of the annular resonator.

However, the above solution cannot produce the desired effect in an apparatus with a relativistic beam, due to the fact that the voltage applied to the deflection yoke must be practically equal to the voltage across the accelerator tube (which means that it must be as high as several megavolts). As a result, the foregoing solution becomes impracticable because of an unavoidable break-down.

A second disadvantage of the known apparatus is due to the following. In order to increase the efficiency, the action of the high-frequency magnetic field of the travelling wave in the annular resonator is compensated by a stationary magnetic field produced by a special magnet having a size close to that of the travelling wave resonator. This way of raising the efficiency of the apparatus makes the latter more complicated and accounts for an increased weight of the apparatus. This applies, in particular, to the long-wave portion of the SHF range.

Still another disadvantage of the known apparatus resides in the absence of means to focus the divergent beam and prevent deposition of charged particles on the walls of the travelling wave resonator and other structural elements, whichs also reduces the amplification factor and power of the apparatus.

It is an essential object of the present invention to provide a vacuum SHF apparatus with a non-bunched relativistic beam, having a high amplification factor and capable of developing great high- and superhigh-frequency powers.

It is another object of the invention to provide a vacuum SHF apparatus having a simpler structure, as compared to the conventional apparatus.

The foregoing and other objects of the present invention are attained by providing a vacuum SHF apparatus comprising a means for forming a charged-particle beam, an accelerating tube for imparting relativistic energies to the charged-particle beam, a deflection yoke for circular scanning of the beam at an input signal frequency, the accelerating tube and the deflection yoke being coaxial with the charged-particle forming means and arranged thereafter, along the path of the charged-particle beam. There is, an annular travelling-wave resonator having annular slots in the broader walls thereof to receive and direct to a collector the charged-particle beam, the resonator being provided with a means for the take-off of SHF power and designed so that its broader walls are parallel with the longitudinal axis of the apparatus, and an additional deflection yoke arranged axially and symmetrically between the deflection yoke and the resonator and intended to deflect the scanned beam outwardly from the longitudinal axis of the apparatus and direct it into the annular resonator slots. The additional deflection yoke is magnetic, according to the invention.

It is recommended that the additional deflection yoke be constructed in the form of a cone whose vertex faces the beam forming means.

Such an additional deflection yoke may be made as an uniformly wound electromagnetic coil or a set of permanent annular magnets of gradually increasing diameters, each magnetized along the height of the magnet ring.

It is advisable that the proposed vacuum SHF apparatus be provided with a magnetic focusing means arranged between the additional deflection yoke and the annular resonator and constructed in the form of at least one pair of rings disposed symmetrically with respect to the beam surface.

The foregoing rings may be electromagnetic coils or permanent magnets.

Compared to the analogous conventional apparatus, the apparatus of the present invention features a 10— to 20— -fold greater amplification factor, a two- to three-fold greater power, and a much simpler structure while maintaining a high efficiency which is close to 100 percent.

Other objects and advantages of the present invention will become more apparent from the following detailed description of preferred embodiments thereof, to be read in conjunction with the accompanying drawings, wherein.

Figure 1:
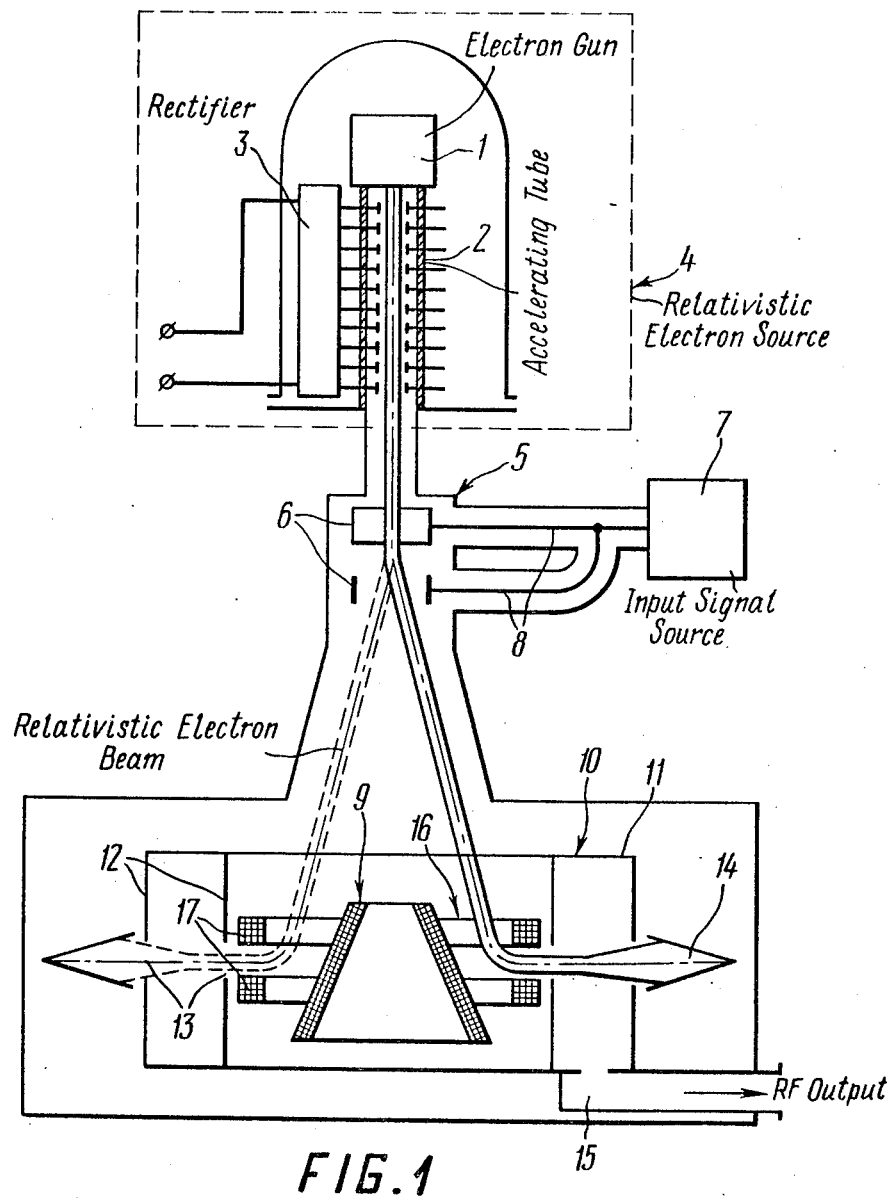
FIG. 1 is a key diagram of the proposed vacuum SHF apparatus.

Referring now to the accompanying drawings, the vacuum SHF apparatus shown in FIG. 1 comprises a means for forming a charged-particle beam, the function of that means being performed by an electron gun 1 which forms an axially symmetrical charged-particle beam. The apparatus further comprises a sectional accelerating tube 2 to impart relativistic energies to charged particles, the accelerating tube being installed at the output of the electron gun 1 and energized from a high-voltage rectifier 3.

The apparatus of this invention can make use of any type of charged particles; it is at its best, however, when use is made of electrons. The present disclosure deals with an embodiment which employs an electron beam.

The electron gun 1, the accelerating tube 2 and the rectifier 3 make up a relativistic electron source 4. In addition, the proposed electrovacuum SHF apparatus comprises a deflection yoke 5 for circular scanning of the electron beam, which yoke is arranged coaxially with the accelerating tube 2 and behind the tube 2, along the electron beam path. The deflecting yoke 5 is made up of two capacitors 6 displaced with respect to each other by 90°, these capacitors being connected to an input signal source 7 by means of coaxial lines 8.

Arranged behind the deflection yoke 5 and coaxially with it is an additional magnetic deflection yoke 9 intended to deflect the scanned beam outwardly from the longitudinal axis of the apparatus and direct the beam to a travellingwave resonator 10.

In the inventive apparatus, the additional deflection yoke is preferably made in the form of a truncated cone arranged so that its vertex faces the electron beam forming means.

It should be noted that the additional deflection yoke may be made as any other body of revolution having a shape close to conical, which body may be made up, for example, of a cylinder and a truncated cone.

The internal dimensions and shape of the hollow annular resonator 10 are selected so that it is capable of maintaining an electromagnetic wave travelling along the annulus at a frequency equal to or divisable by the beam scanning frequency, which electromagnetic wave has an electric field substantially parallel to the direction of the beam particles.

The resonator 10 has end face walls 11 and broader side walls 12, the latter being provided with slots 13 for the passage of the beam, the walls 12 being parallel with the longitudinal axis of the apparatus. A collector 14 is intended to receive particles arriving from the resonator 10. The resonator 10 is also provided with a SHF power take-off means constructed as a directional coupler 15.

Arranged between the deflection yoke 9 and the resonator 10 is a magnetic focusing means 16 made up of two symmetrical annular electromagnetic coils 17 with magnetic fields that are opposite in direction, the coils being disposed symmetrically with respect to the beam travel plane.

The focusing means may also be constructed in the form of two or more pairs of coils, or at least one pair of annular permanent magnets having the same shape as the coils 17 and magnetized in the radial direction (not shown).

Figure 2:
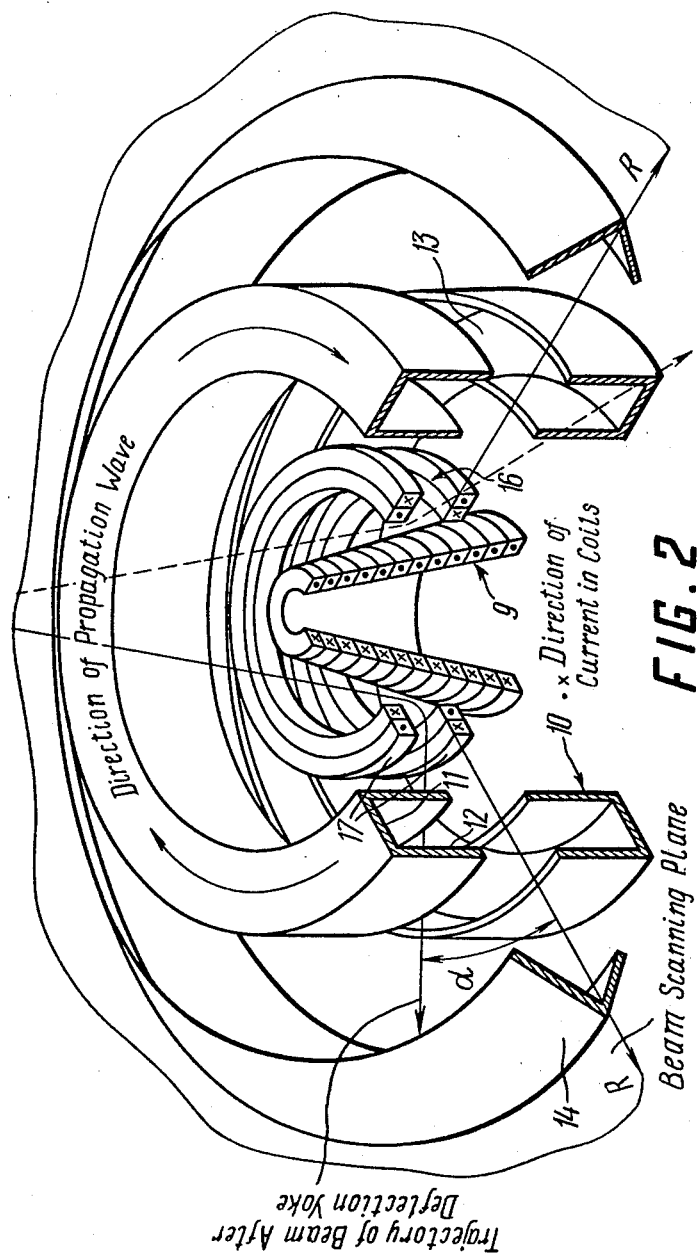
FIG. 2 is an isometric view of the mutual arrangement of the travelling-wave resonator, collector, focusing means and deflection yoke.

FIG. 2 is an isometric view of the travelling-wave resonator 10, collector 14, focusing means 16 constructed as two pairs of the coils 17, and the magnetic deflection yoke 9. It is clear from FIG. 2 that after the deflection yoke 9 the beam travels in the plane which is perpendicular to the longitudinal axis of the apparatus and at an angle $\alpha$ to the radial direction (R), which makes it possible to dispense with compensating magnets.

Figure 3:
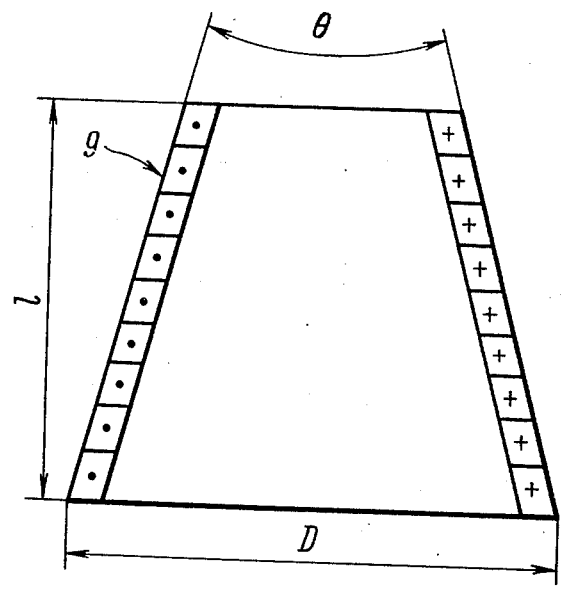
FIG. 3 is a schematic representation of the deflection yoke constructed as an electromagnetic coil.

FIG. 3 is a schematic representation of an embodiment of the additional magnetic deflection yoke 9 constructed as an uniformly wound electromagnetic coil shaped as a truncated cone.

A selection of a diameter D of the coil base, a coil height 1, and an angle $\theta$ at the cone vertex with the aid of a computer may ensure a deflection of particles in the magnetic field of the coil outwardly from the longitudinal axis of the apparatus, toward the slots 13 (FIG.2) of the annular resonator 10, at an angle $\alpha$ in the azimuth direction (i.e. at a certain azimuth speed).

Figure 4:
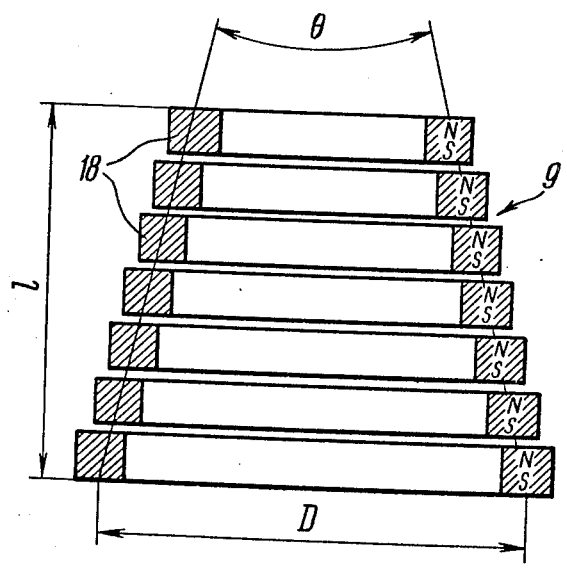
FIG. 4 is a schematic representation of the defletction yoke constructed as a set of annular permanent magnets.

FIG. 4 is a schematic representation of the additional deflection yoke constructed as a set of annular permanent magnets 18 of gradually increasing diameters, which magnets are magnetized along the height of the magnet rings in the direction N-S. The dimensions and shape of said magnets are selected so that they are similar to the shape of the conical coil shown in FIG. 3.

Figure 5:
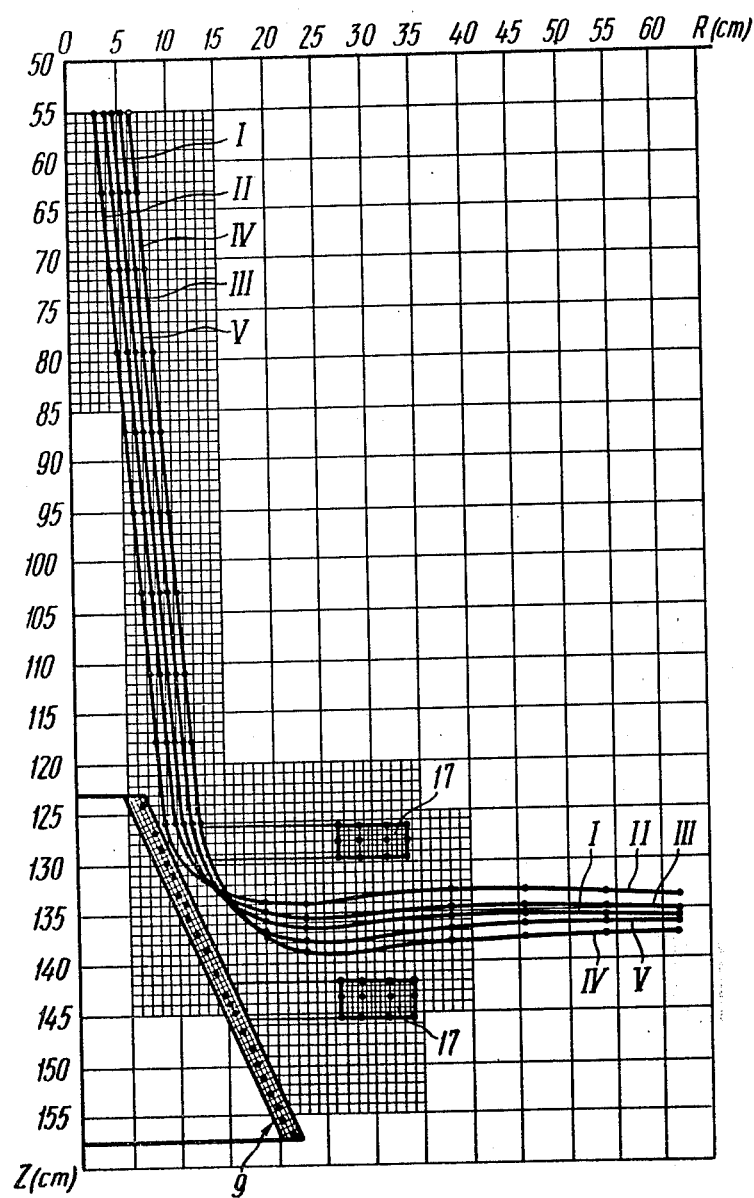
FIG. 5 shows the beam trajectory in the apparatus in the R and Z coordinates.
Figure 6:
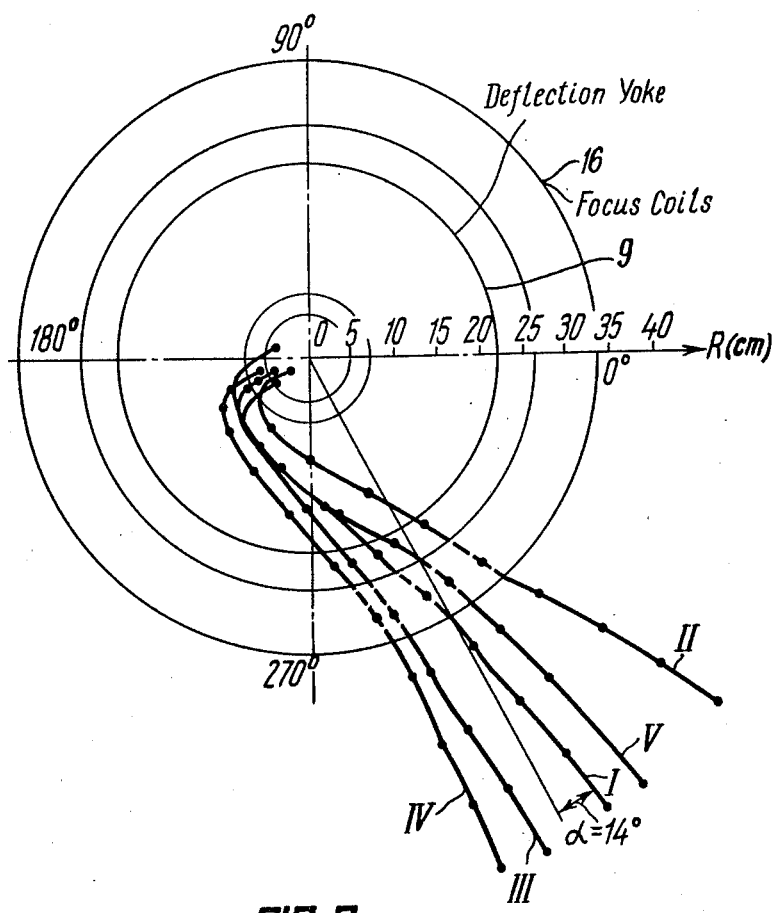
FIG. 6 shows the beam trajectory in the apparatus in the R and $\phi$ coordinates.

FIGS. 5 and 6 show electron trajectories, calculated with the aid of a computer for one of specific embodiments of the proposed apparatus, in the magnetic fields of the deflection yoke and focusing means, said trajectories being plotted in the coordinates R, Z and R, $\phi$, respectively. The trajectories are plotted according to the cylindrical coordinate system (R, Z, $\phi$), where the Z axis coincides with the longitudinal axis of the apparatus, whereas the origin of coordinates is found on the upper (FIG. 1) end face of the circular scanning deflection yoke 5. FIGS. 5 and 6 show, to a corresponding scale, the dimensions of the magnetic deflection yoke 9 and the focusing means 16. When calculating the trajectories, it was assumed that at the moment of entering the circular scanning means the beam had a radius of 2 cm and only the axial velocity component. FIGS. 5 and 6 show 5 trajectories, of which curve I corresponds to the trajectory of an electron that has entered the circular scanning means along the symmetry axis of the apparatus, whereas curves II, III, IV and V correspond to the trajectories of electrons that have entered the circular scanning means at points spaced at a distance of 2 cm from the symmetry axis and displaced in azimuth by 90° relative to one another. As is seen from FIG. 6, deflected electrons travel at an angle $\alpha$ 14° to the axis and in the plane (R, $\phi$). This angle is necessary to ensure an electron efficiency close to 100 percent, if the electron energy is 1 MeV and the phase velocity of the wave propagating in the annular resonator is about two times as high as the velocity of light.

The proposed apparatus operates as follows. The electron gun 1 (FIG. 1), which forms an electron beam, has a potential of 1–3 megavolts with respect to the last electrode of the sectional accelerating tube 2, whereto voltage is applied from the rectifier 3. The beam of particles, which has been formed and accelerated to reach relativistic energies, enters the deflection yoke 5 which is excited by the input signal source 7. The input signal is divided in two and applied to the deflection yoke 5 via two coaxial lines 8 whose lengths are selected so that signals applied to the capacitors 6 are displaced in phase by 90°. Such a system produces a high-frequency electrical deflection field with circular polarization, whereby circular scanning of the charged-particle beam is effected.

The beam then enters the magnetic field of the deflection yoke 9 and is directed into the slots 13 of the annular resonator 10. Deflected under the action of the input signal and being continuously shifted in azimuth, the electron beam describes a conical surface which gradually passes into a plane perpendicular to the longitudinal axis of the apparatus (a disc beam). Upon entering the resonator 10, the beam excites a travelling wave therein, is decelerated in the wave's electric field and gives up its energy which is then directed to the load via the directional coupler 15. The residual energy of the beam is dissipated in the collector 14. The conversion of the scanned beam from the conical to disc beam makes it possible to raise the amplification factor of the apparatus, as in this case the beam deflection angle in the circular scanning means is considerably decreased, whereas the power required for scanning the beam is proportional to the square of said angle. The main deflection of the beam is effected by the additional deflection yoke 9 which is only operated by direct current, the power consumption in this case being not in excess of 0.–0.2 percent of the hf output power of the apparatus.

As is seen from FIGS. 2 and 6, upon entering the annular resonator 10, electrons hace, apart from the radial and axial velocity components (FIG. 5), an azimuth velocity as well, which velocity is determined, for an electron found on the beam axis, by the angle $\alpha$ equal to about 14° with the dimensions indicated in FIG. 6. Moving in trajectories close to radial as they pass through the annular resonator, electrons excite a travelling wave therein, whose field structure is similar to that of the $H_{10}$ type of wave in a rectangular waveguide which is bent into a loop. As this takes place, the electrons give up their energy to save wave. While interacting with the high-frequency magnetic field of said wave, the electrons are deflected in the azimuth direction opposite the direction of the wave propagation. As a result, the efficiency of the interaction between the electron beam and the SHF field of the traveling wave is reduced. Estimates show that the efficiency can be raised by imparting to electrons an additional azimuth velocity upon their entering the resonator, which azimuth velocity is directed towards the direction of the travelling wave propagation. With the aboveindicated magnitudes of electron energy and the output resonator parameters, this velocity is 15–30 percent of the value of the radial velocity component. In the proposed apparatus this azimuth velocity is imparted to the electron beam by the magnetic deflection yoke. The azimuth velocity direction depends upon the direction of the current through the winding of the conical coil of the deflection yoke 9. By appropriately selecting the current direction and the scanning diameter, it is possible by changing the angle $\alpha$, to obtain an efficiency close to 100 percent, With a 100 percent efficiency, the azimuth velocity imparted to an electron as a result of interaction thereof with the SHF magnetic field of the travelling wave is equal in magnitude and opposite in direction to the azimuth velocity acquired by the electron in the deflection yoke. The focusing of the beam prior to its entry into the travelling-wave resonator 10 is done with the aid of the focusing means 16 which produces an alternating magnetic field in the symmetry plane of the travelling-wave resonator 10 and makes it possible to substantially raise the power output of the apparatus due to an increase in the beam current and a decreased deposition of particles on the walls of the travelling-wave resonator 10.

What is claimed is:

1. A vacuum SHF apparatus comprising: means for forming a charged-particle beam to be directed along the longitudinal axis of the apparatus; an accelerating tube arranged at the output of said beam forming means, for imparting a velocity close to that of light to the charged particles of the beam; a first deflection yoke for circular scanning of the beam at an input signal frequency, said first yoke being arranged behind said tube, along the beam path, and coaxially with said beam forming means; an additional magnetic deflection yoke arranged successively along the beam path behind said first yoke and coaxially therewith, for deflecting the scanned beam outwardly from the longitudinal axis; a hollow annular resonator arranged successively behind said additional yoke and coaxially therewith along the beam path; said resonator having broader walls that are parallel with the longitudinal axis; annular slots being provided in said resonator walls for the beam, that has been deflected by said additional yoke, to pass through said slots; circular windings through which current flows from said additional yoke, positioned in planes perpendicular to the longitudinal axis, the radius pitch of said windings being chosen to ensure that the particle beam passes through said slots at a velocity close to zero in the axial direction and with a specific ratio between azimuth and radial components; the internal dimensions and shape of said resonator being such that it can maintain an electromagnetic wave traveling along said resonator at a frequency equal to the standing frequency of the beam or its multiple, the electromagnetic wave having an electric field substantially parallel to the path of the beam particles; a collector arranged successively behind said resonator, along the beam path for receiving the charged-particle beam as it leaves said resonator; and means for deriving SHF power from said resonator.

2. The vacuum SHF apparatus as defined in claim 1, wherein said additional deflection yoke is shaped as a cone with a uniform winding, the current flowing through said additional yoke, the vortex of said cone facing said forming means.

3. The vacuum SHF apparatus as defined in claim 1, further comprising: magnetic focusing means disposed between said additional deflection yoke and said resonator; said focusing means being constructed as at least one pair of annular coils through which the current flows, said annular coils being arranged roughly symmetrical to the beam surface.

4. The vacuum SHF apparatus as defined in claim 1, further comprising: magnetic focusing means disposed between said additional deflection yoke and said resonator; said focusing means being constructed as at least one pair of annular permanent magnets magnetized in the radial direction and arranged roughly symmetrical to the beam surface.

5. A vacuum SHF apparatus comprising: means for forming a charged-particle beam to be directed along the longitudinal axis of the apparatus; an accelerating tube arranged at the output of said beam forming means, for imparting a velocity close to that of light to the charged particles of the beam; a first deflection yoke for circular scanning of the beam at an input signal frequency, said first yoke being arranged behind said tube, along the beam path, and coaxially with said beam forming means; an additional magnetic deflection yoke arranged successively along the beam path behind said first yoke and coaxially therewith, for deflecting the scanned beam outwardly from the longitudinal axis; a hollow annular resonator arranged successively behind said additional yoke and coaxially therewith along the beam path; said resonator having broader walls that are parallel with the longitudinal axis; annular slots being provided in said resonator walls for the beam, that has been deflected by said additional yoke, to pass through said slots; annular permanent magnets of said additional yoke arranged in planes perpendicular to the longitudinal axis, said magnets being magnetized in a direction parallel to the axis and being of such radius and height that the particle beam passes through said slots at a velocity close to zero in the axial direction and with a specific ratio between azimuth and radial components; the internal dimensions and shape of said resonator being such that it can maintain an electromagnetic wave traveling along said resonator at a frequency equal to the standing frequency of the beam or its multiple, the electromagnetic wave having an electric field substantially parallel to the path of the beam particles; a collector arranged successively behind said resonator, along the beam path for receiving the charged-particle beam as it leaves said resonator; and means for deriving SHF power from said resonator.

* * * * *